United States Patent
Song et al.

(10) Patent No.: US 8,570,109 B2
(45) Date of Patent: Oct. 29, 2013

(54) RING OSCILLATOR FOR GENERATING OSCILLATING CLOCK SIGNAL

(75) Inventors: Taek-Sang Song, Gyeonggi-do (KR); Dae-Han Kwon, Gyeonggi-do (KR); Dae-Kun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 210 days.

(21) Appl. No.: 13/081,119

(22) Filed: Apr. 6, 2011

(65) Prior Publication Data

US 2011/0181332 A1    Jul. 28, 2011

Related U.S. Application Data

(62) Division of application No. 12/266,608, filed on Nov. 7, 2008, now abandoned.

(30) Foreign Application Priority Data

Jun. 30, 2008 (KR) .................. 10-2008-0063134

(51) Int. Cl.
    *H03K 3/03* (2006.01)

(52) U.S. Cl.
    USPC ............. 331/57; 331/172; 327/233; 327/254

(58) Field of Classification Search
    USPC ............ 331/57, 46, 47, 50, 55, 172; 327/144, 327/146, 147, 155, 156, 165, 178, 231, 233, 327/235, 238, 240, 246, 247, 254, 255, 295, 327/296
    See application file for complete search history.

(56) References Cited

U.S. PATENT DOCUMENTS

| | | | | |
|---|---|---|---|---|
| 5,438,301 | A * | 8/1995 | Havens et al. | 331/45 |
| 6,118,291 | A * | 9/2000 | Martin et al. | 324/750.25 |
| 6,188,291 | B1 * | 2/2001 | Gopinathan et al. | 331/45 |
| 2007/0001719 | A1 * | 1/2007 | Hulfachor et al. | 327/117 |
| 2007/0182497 | A1 * | 8/2007 | Tzartzanis et al. | 331/57 |

FOREIGN PATENT DOCUMENTS

| | | |
|---|---|---|
| JP | 2000-91892 | 3/2000 |
| JP | 2000-156629 | 6/2000 |
| JP | 2001-94418 | 4/2001 |
| JP | 2001-358565 | 12/2001 |
| JP | 2005-536923 | 12/2005 |
| JP | 2007-274431 | 10/2007 |

OTHER PUBLICATIONS

Notice of Preliminary Rejection issued by the Japanese Patent Office on Mar. 12, 2013.

Rofougaran, A., et al., "A 900MHz CMOS LC-Oscillator with Quadrature Outpus," IEEE International Solid-State Circuits Conferences, 1996, pp. 392-393.

* cited by examiner

*Primary Examiner* — Ryan Johnson
(74) *Attorney, Agent, or Firm* — IP & T Group LLP (57) ABSTRACT

A ring oscillator including a plurality of buffer units, each of which has a cross-coupled structure, for generating clock signals using a bias voltage having a predetermined voltage level applied thereto, wherein the clock signals have a swing width corresponding to the bias voltage.

8 Claims, 4 Drawing Sheets

FIG. 4 ature of the bias voltage.

RING OSCILLATOR FOR GENERATING OSCILLATING CLOCK SIGNAL

CROSS-REFERENCE TO RELATED APPLICATION

This application is a division of U.S. patent application Ser. No. 12/266,608 filed on Nov. 7, 2008 now abandoned, which claims priority of Korean patent application number 10-2008-0063134, filed on Jun. 30, 2008. The disclosure of each of the foregoing applications is incorporated herein by reference in its entirety.

BACKGROUND OF THE INVENTION

The present invention relates to a semiconductor design technology, and more particularly, to a ring oscillator for generating an oscillating clock signal and a multi-phase clock correction circuit for correcting the phase of a multi-phase clock signal using the same.

In general, a semiconductor device, such as Double Data Rate Synchronous DRAM (DDR SDRAM), includes diverse circuits for performing a variety of circuit operations. As one of these diverse circuits, there is a ring oscillator. Typically, the ring oscillator is provided with an odd number of inverters to generate an oscillating clock signal. Recently, however, a ring oscillator with an even number of inverters as shown in FIG. 1 has been mainly employed.

Figure 1:
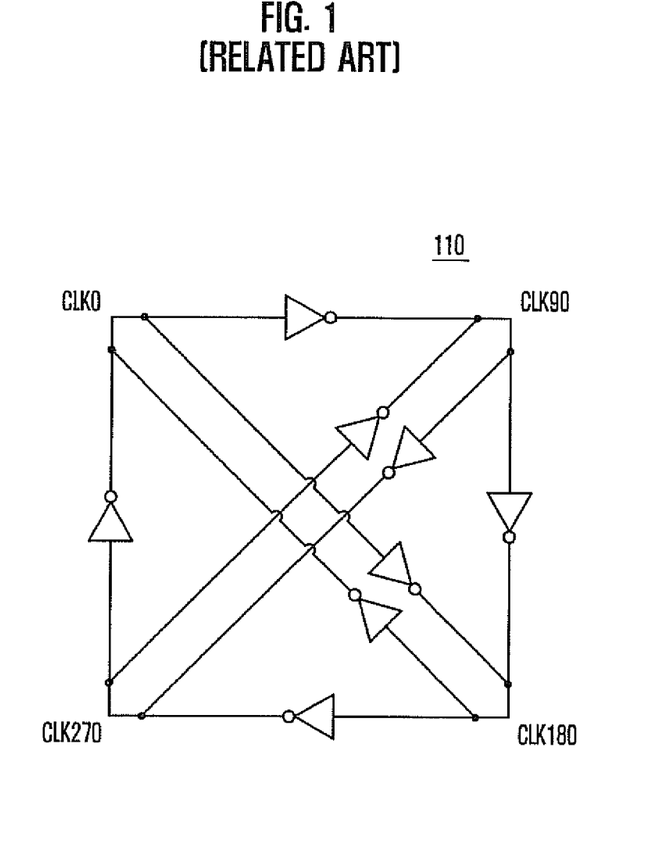
FIG. 1 a circuit diagram for explaining an existing ring oscillator.

Referring to the circuit diagram of FIG. 1, the existing ring oscillator 110 is provided with multiple inverters to produce first to fourth oscillating clock signals CLK0, CLK90, CLK180, and CLK270, respectively. Since the circuit configuration and operation of the ring oscillator 110 is well-known to those skilled in the art, details thereof will be omitted here for the sake of brevity. Here, the first clock signal CLK0 has a phase opposite to that of the third clock signal CLK180 and the second clock signal CLK90 has a phase opposite to that of the fourth clock signal CLK270. Thus, the second clock signal CLK90 is 90° out of phase with the first clock signal CLK0, the third clock signal CLK270 is 180° out of phase with the first clock signal CLK0, and the fourth clock signal CLK270 is 270° out of phase with the first clock signal CLK0. For reference, each of the first to fourth clock signals CLK0, CLK90, CLK180, and CLK270 oscillates because each inverter has a nonlinear property in operation.

Each of the inverters executes an inversion operation in response to an external power supply voltage applied thereto, to generate first to fourth oscillating clock signals CLK0, CLK90, CLK180, and CLK270. Thus, the first to fourth clock signals CLK0, CLK90, CLK180, and CLK270 oscillate by full swing at a voltage level between the external power supply voltage and ground voltage. That is, these clock signals oscillate at a CMOS level.

Meanwhile, semiconductor devices are designed to operate at high speed and to have low jitter characteristics. Thus, in recent years persons skilled in the art have preferred a clock signal of a Current Mode Logic (CML) level whose swing width is small over a clock signal of a CMOS level. Typically, a CML level clock signal consumes less power in high speed operation and has lower jitter characteristics than a CMOS level clock signal.

However, the existing ring oscillator by its configuration has to generate a CMOS level clock signal rather than a CML level clock signal, and thus, it is not suitable for semiconductor devices of current design.

SUMMARY OF THE INVENTION

An embodiment of the present invention is directed to providing a ring oscillator capable of generating CML level clock signals, which is oscillated by a plurality of buffers having a cross-coupled structure.

Another embodiment of the invention is directed to a multi-phase clock correction circuit capable of generating a multi-phase clock signal with a desired frequency and predetermined phase differences by correcting reference phase clock signals.

In accordance with an aspect of the invention, a ring oscillator includes a plurality of buffer units, each of which has a cross-coupled structure, for generating a plurality of clock signals using a bias voltage of a predetermined voltage level applied thereto, wherein the plurality of clock signals have a swing width corresponding to the bias voltage.

In accordance with another aspect of the invention, a multi-phase clock correction circuit includes an input unit for inputting reference phase clock signals, an oscillator for receiving a bias voltage having a predetermined voltage level, and correcting phases of the signals received via the input unit to generate a multi-phase clock signal, wherein the multi-phase clock signal has a swing width corresponding to the bias voltage.

In accordance with another aspect of the invention, there is provided a multi-phase clock correction circuit comprising a first multi-phase clock signal generator, having a cross-coupled structure, for differentially receiving first and third reference phase clock signals and receiving second and fourth phase clock signals to generate their corresponding first and third phase clock signals and a second multi-phase clock signal generator, having a cross couple structure, for differentially receiving second and fourth reference phase clock signals and receiving the first and the third phase clock signals to produce their corresponding second and fourth phase clock signals, wherein each of the first and second multi-phase clock signal generators receives a bias voltage, and the first to fourth phase clock signals have a swing width corresponding to the bias voltage.

The ring oscillator in accordance with the invention employs a plurality of buffers having a cross-coupled structure, which is capable of generating clock signals of a CML level, thereby generating clock signals that consume less power in a high speed operation and have low jitter characteristics. In addition, the ring oscillator in accordance with the invention can use reference phase clock signals injected thereinto to generate a multi-phase clock signal, which indicates the reference phase clock signals whose phases are corrected. The multi-phase clock signal so generated may have predetermined phase differences and also have a frequency corresponding to the reference phase clock signals.

DESCRIPTION OF SPECIFIC EMBODIMENTS

Hereinafter, a preferred embodiment in accordance with the present invention will be described in detail with reference to the accompanying drawings so that the invention can readily be practiced by those skilled in the art to which the invention pertains.

Figure 2:
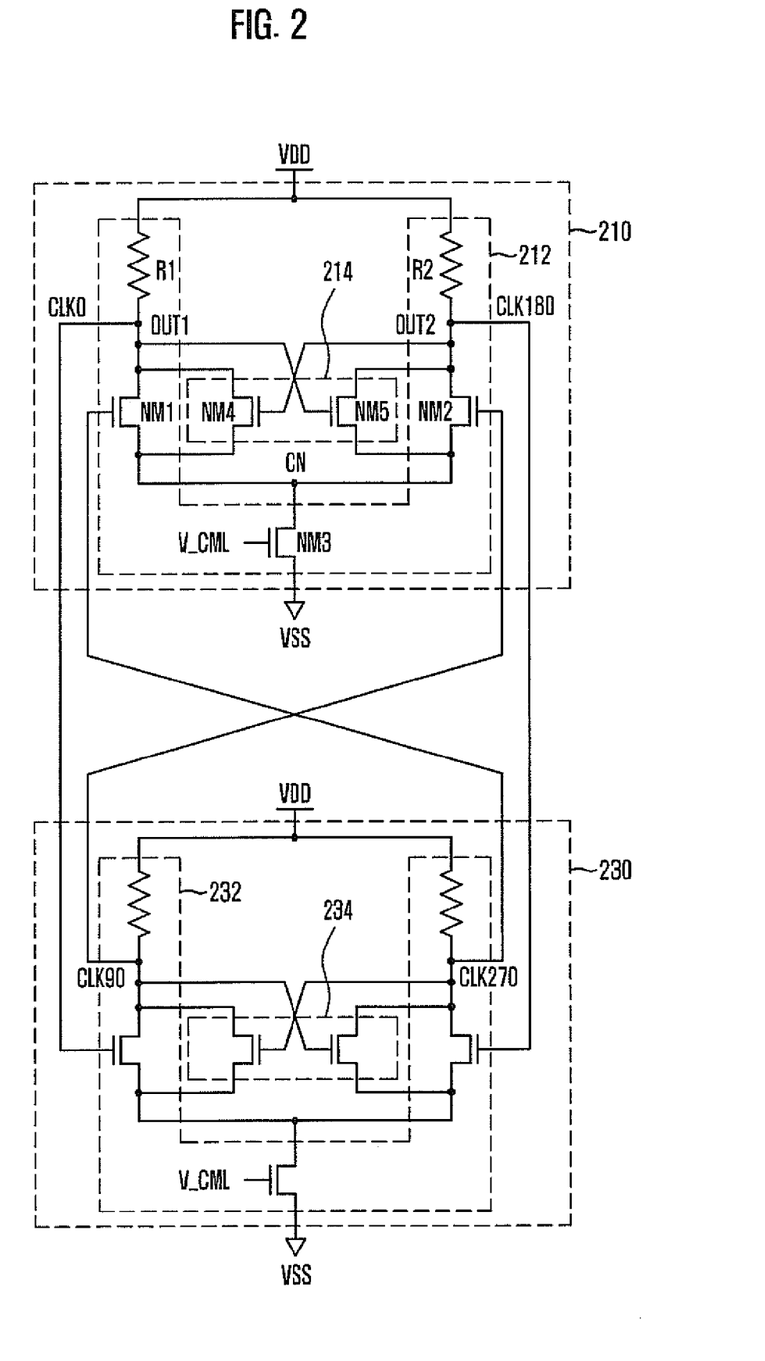
FIG. 2 is a circuit diagram for explaining a ring oscillator in accordance with an embodiment of the present invention.

FIG. 2 is a circuit diagram for explaining a ring oscillator in accordance with an embodiment of the invention.

Referring to FIG. 2, the ring oscillator of the invention is for generating first to fourth clock signals CLK0, CLK90, CLK180, and CLK270 of a CML level having predetermined phase differences, and can include first and second buffer units 210 and 230. The first and second buffer units 210 and 230 have a cross-coupled structure, and generate first to fourth clock signals CLK0, CLK90, CLK180, and CLK270 using a bias voltage V_CML having a predetermined voltage level applied thereto.

Here, the first buffer unit 210 is for buffering the second and the fourth clock signals CLK90 and CLK270 which are output signals from the second buffer unit 230 to generate their corresponding first and third clock signals CLK0 and CLK180, and is provided with a first CML buffer circuit 212 and a first feedback circuit 214.

More specifically, the first CML buffer circuit 212 differentially receives the second and the fourth clock signals CLK90 and CLK270 to differentially output their corresponding first and third clock signals CLK0 and CLK180. To this end, the first CML buffer circuit 212 is composed of a first resistor R1 coupled between an external power supply voltage VDD terminal and a first output terminal OUT1 outputting the first clock signal CLK0, a first NMOS transistor NM1 having a source-drain path formed between the first output terminal OUT1 and a common node CN and whose gate takes the fourth clock signal CLK270, a second resistor R2 coupled between the external power supply voltage VDD terminal and a second output terminal OUT2 outputting the third clock signal CLK180, a second NMOS transistor NM2 having a source-drain path formed between the second output terminal OUT2 and the common node CN and whose gate accepts the second clock signal CLK90, and a third NMOS transistor NM3 having a source-drain path formed between the common node CN and a ground voltage VSS and whose gate receives a bias voltage V_CML.

Here, the first and the second NMOS transistors NM1 and NM2 are differential input portions for differentially taking the second and the fourth clock signals CLK0 and CLK270, respectively, and the first and the second resistors R1 and R2 are loading portions having loading values corresponding to a CML level. And, the third NMOS transistor NM3 is a sinking portion for sinking a current corresponding to the bias voltage V_CML.

The first feedback circuit 214 is for performing a feedback operation at the first and the second output terminals OUT1 and OUT2 of the first CML buffer circuit 212. For this, it can be composed of a fourth NMOS transistor NM4 having a source-drain path formed between the first output terminal OUT1 and the common node CN and whose gate is coupled to the second output terminal OUT2, and a fifth NMOS transistor NM5 having a source-drain path formed between the second output terminal OUT2 and the common node CN and whose gate is coupled to the first output terminal OUT1. In this way, the first feedback circuit 214 is coupled to correspond to the first and the second NMOS transistors NM1 and NM2 which are differential input portions, and operates in response to the first and the third clock signals CLK0 and CLK180.

In the meantime, a circuit configuration of the second buffer unit 230 is similar to that of the first buffer unit 210, and therefore, details thereof will be omitted here. But, one difference between them is that the first buffer unit 210 differentially receives and buffers the second and the fourth clock signals CLK90 and CLK270 outputted from the second buffer unit 230 to differentially output the first and the third clock signals CLK0 and CLK180, and the second buffer unit 230 differentially takes and buffers the first and the third clock signals CLK0 and CLK180 from the first buffer unit 210 to differentially generate the second and the fourth clock signals CLK90 and CLK270.

Here, a differential output end of the second buffer unit 230 and a differential input end of the first buffer unit 210 are preferably connected to have a cross-coupled structure. That is, the output terminal outputting the second clock signal CLK90 can be coupled to the gate of the first NMOS transistor NM1 in the first buffer unit 210, and the output terminal outputting the fourth clock signal CLK270 can be coupled to the gate of the second NMOS transistor NM2 of the first buffer unit 210.

Hereinafter, an operation of each of the first and the second buffer units 210 and 230 will be described in detail. Since the operation of the first buffer unit 210 is similar to that of the second buffer unit 230, a description will be made mainly for the first buffer unit 210.

First, it is assumed that the second clock signal CLK90 will gradually become a logic high level. Then, since the fourth clock signal CLK270 has an opposite phase to the second clock signal CLK90 by its circuit structure, it will gradually become a logic low level.

As the second clock signal CLK90 gradually becomes a logic high level, the second NMOS transistor NM2 becomes gradually turned on, while as the fourth clock signal CLK270 gradually becomes a logic low level, the first NMOS transistor NM1 becomes gradually turned off. Thus, the first output terminal OUT1 will have a higher voltage level than the second output terminal OUT2. Then, the first output terminal OUT1 that gets higher than the voltage level at the second output terminal OUT2 turns the fifth NMOS transistor NM5 on gradually, thereby gradually lowering the voltage level at the second output terminal OUT2. The second output terminal OUT2 having the voltage level lowered in this way turns the fourth NMOS transistor NM4 off gradually, thereby gradually increasing a voltage level at the first output terminal OUT1. That is to say, the slightly increased voltage level at the first output terminal OUT1 is feedbacked to further increase its own voltage level. In other words, through the feedback operation of the feedback circuit 214, the voltage level at the first output terminal OUT1 gradually increases and the voltage level at the second output terminal OUT2 gradually decreases.

Thereafter, the first clock signal CLK0 of a logic high level and the third clock signal CLK180 of a logic low level which are generated by the feedback operation of the feedback circuit 214 are provided to the second buffer unit 230. Then, the second buffer unit 230 generates the second clock signal CLK90 of a logic low level and the fourth clock signal CLK270 with a logic high level by performing the same operation as in the first buffer unit 210.

Next, it is assumed that the second clock signal CLK90 will gradually become a logic low level. Then, since the fourth clock signal CLK270 has an opposite phase to the second clock signal CLK90 by its circuit structure, it will gradually become a logic high level.

As the second clock signal CLK90 gradually becomes a logic low level, the second NMOS transistor NM2 becomes gradually turned off, while as the fourth clock signal CLK270 gradually becomes a logic high level, the first NMOS transistor NM1 becomes gradually turned on. Thus, the first output terminal OUT1 has a lower voltage level than the second output terminal OUT2. Then, the first output terminal OUT1 that gets lower than a voltage level at the second output terminal OUT2 turns the fifth NMOS transistor NM5 off gradually, thereby gradually elevating the voltage level at the second output terminal OUT2. The second output terminal OUT2 having the voltage level elevated in this way turns the fourth NMOS transistor NM4 on gradually, thereby gradually lowering a voltage level at the first output terminal OUT1. That is to say, the slightly low voltage level at the first output terminal OUT1 is feedbacked to further lower its own voltage level. In other words, through the feedback operation of there first feedback circuit 214, the voltage level at the first output terminal OUT1 gradually decreases and the voltage level at the second output terminal OUT2 gradually increases.

Thereafter, the first clock signal CLK0 of a logic low level and the third clock signal CLK180 of a logic high level which are generated by the feedback operation of the first buffer unit 210 are inputted to the second buffer unit 230. Then, the second buffer unit 230 generates the second clock signal CLK90 of a logic high level and the fourth clock signal CLK270 of a logic low level by carrying out the same operation as in the first buffer unit 210.

In result, the first to fourth clock signals CLK0, CLK90, CLK180, and CLK270 that are outputted from the first and the second buffer units 210 and 230 are oscillated with predetermined phase differences. That is, these clock signals are oscillated in a manner that the second clock signal CLK90 has a 90° phase difference from the first clock signal CLK0, the third clock signal CLK180 has a 90° phase difference from the second clock signal CLK90, the fourth clock signal CLK270 has a 90° phase difference from the third clock signal CLK180, and the first clock signal CLK0 has a 90° phase difference from the fourth clock signal CLK270.

Here, the first to fourth clock signals CLK0, CLK90, CLK180, and CLK270 may be clock signals having a swing width corresponding to the bias voltage V_CML, i.e., a CML level. The existing ring oscillator generated clock signals of a CMOS level having a swing width between an external power supply voltage VDD and a ground voltage VSS. However, the ring oscillator in accordance with the invention can generate clock signals of a CML level having a swing width corresponding to a voltage value that is obtained by multiplying a current flowing into the third NMOS transistor NM3 by a loading value of a first or second resistor (R1, or R2). That is, the first to fourth clock signals CLK0, CLK90, CLK180, and CLK270 may have a swing width less than a potential difference between the external power supply voltage VDD and the ground voltage VSS applied to the first and the second buffer units 210 and 230. As a result, the ring oscillator in accordance with the invention incorporates the first and the second buffer units 210 and 230 having a cross-coupled structure, so that it can generate the first to fourth clock signals CLK0, CLK90, CLK180, and CLK270 of CML level that consume less power in a high speed operation and have a CML level with low jitter characteristics.

For reference, the ring oscillator may perform an oscillation operation by being provided with at least four CML buffer circuits such as the first and the second CML buffer circuits 212 and 232, but it is not possible to perform an oscillation operation due to too low gain if only two CML buffer circuits are provided. On the contrary, the ring oscillator in accordance with the invention is provided with the first and the second feedback circuits 214 and 234 having a cross-coupled structure in the first and the second CML buffer circuits 212 and 232, thereby generating the first to fourth clock signals CLK0, CLK90, CLK180, and CLK270 having a CML level and predetermined phase differences.

Meanwhile, semiconductor devices, including DDR SDRAM, generate an internal clock signal from an external clock signal applied thereto and drive diverse circuits provided therein by using the internal clock signal. These days, as semiconductor devices develop in the direction of achieving high speed operation and large capacity, the frequency of the external clock signal rises to a band of more than gigahertz (GHz) and thus the frequency of its internal clock signal also rises accordingly.

However, there is a limit to the rise of the frequency of the external clock signal. In order to overcome this limit, a multi-phase clock has been used in recent years. The multi-phase clock refers to a plurality of phase clock signals with predetermined phase differences corresponding to a reference clock signal. A semiconductor device enables a large amount of data to be processed with the plurality of phase clock signals. Typically, the multi-phase clock denotes four phase clock signals with 0°, 90°, 180°, and 270° phase differences from a reference clock signal.

For example, supposing that, if data is processed at a rising edge of a reference clock signal, a data processing rate is 1, if data is processed by the four phase clock signals, a data processing rate may be 4. That is, if data is processed by the four phase clock signals having the same frequency, data processing efficiency can increase four times, compared to data processing by the reference clock signal.

Meanwhile, in case the multi-phase clock is used, the phase differences of the respective phase clock signals should be precisely kept. However, there may be a mismatch in the phase differences of the respective phase clock signals due to several reasons. Therefore, the semiconductor device preferably incorporates a multi-phase clock correction circuit for correcting such a mismatch. This specification presents a multi-phase clock correction circuit using the ring oscillator shown in FIG. 2.

Figure 3:
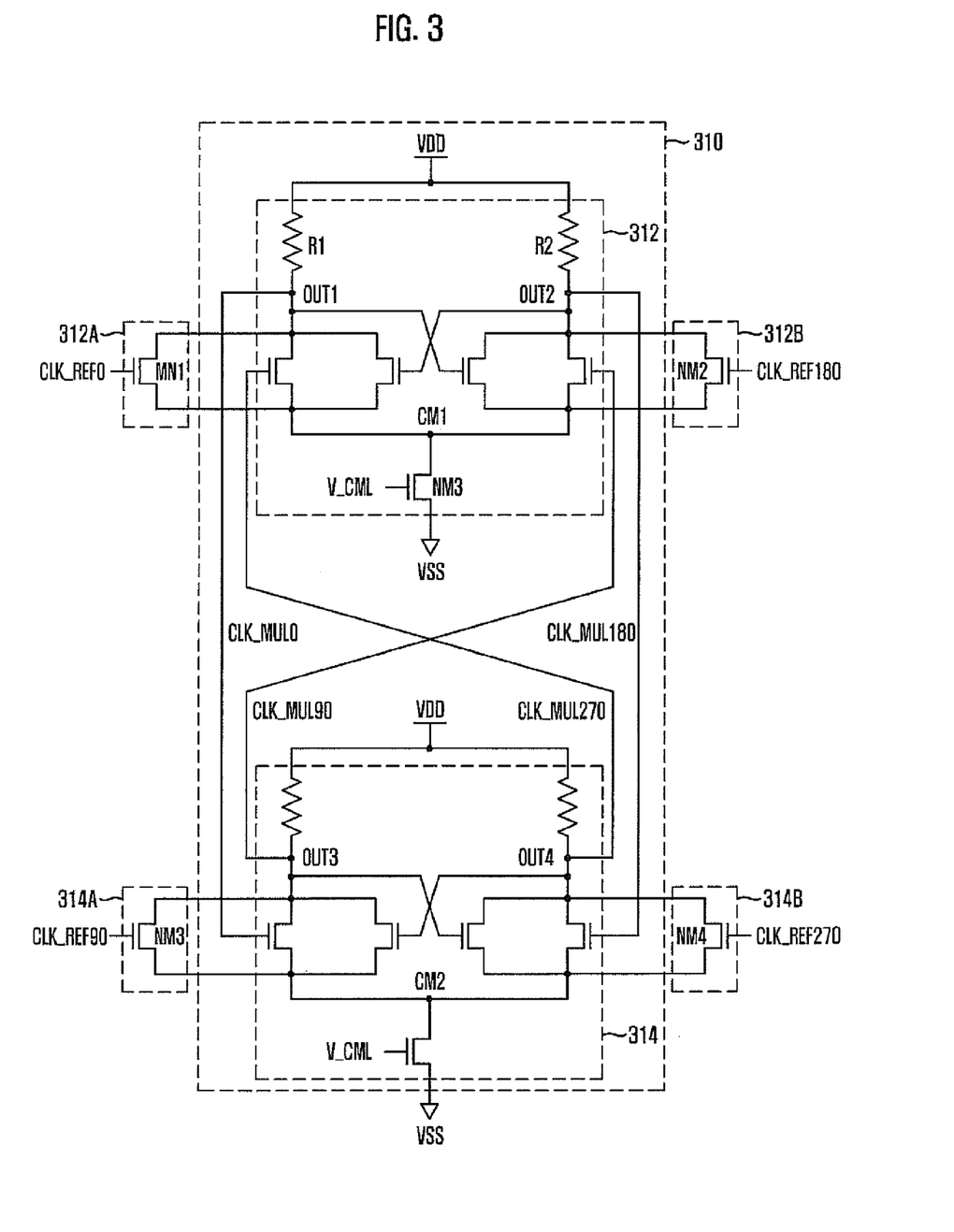
FIG. 3 is a circuit diagram for explaining a multi-phase clock correction circuit using the ring oscillator depicted in FIG. 2.

FIG. 3 is a circuit diagram for explaining a multi-phase clock correction circuit using the ring oscillator depicted in FIG. 2.

Referring to FIG. 3, the multi-phase clock correction circuit can include a ring oscillator 310, and first to fourth injection units 312A, 312B, 314A, and 314B.

The ring oscillator 310 is for receiving a bias voltage V_CML having a preset voltage level and correcting phases of first to fourth reference phase clock signals CLK_REF0, CLK_REF90, CLK_REF180, and CLK_REF270 applied via the first to fourth injection units 312A, 312B, 314A, and 314B to generate first to fourth phase clock signals CLK_MUL0, CLK_MUL90, CLK_MUL180, and CLK_MUL270, which indicate a multi-phase clock signal. To this end, it can be composed of first and second buffer units 312 and 314. Since a circuit configuration and an operation of the ring oscillator 310 are substantially identical to those set forth in FIG. 2, details thereof will be omitted here.

To be more specific, the first to fourth injection units 312A, 312B, 314A, and 314B can take the first to fourth reference phase clock signals CLK_REF0, CLK_REF90, CLK_REF180, and CLK_REF270 and inject them into the ring oscillator 310. Here, as noted above, the first to fourth reference phase clock signals CLK_REF0, CLK_REF90, CLK_REF180, and CLK_REF270 have predetermined phase differences, but there may be a mismatch in those phase differences because of several reasons. For reference, the first to fourth reference phase clock signals CLK_REF0, CLK_REF90, CLK_REF180, and CLK_REF270 may be generated by using a reference clock signal corresponding to an external clock signal. A circuit for generating these clock signals is obvious to those skilled in the art, and therefore, a detailed description thereon will be omitted here.

The first and second injection units 312A and 312B are for taking the first and the third reference phase clock signals CLK_REF0 and CLK_REF180, and injecting them into the first buffer unit 312. For this, the first injection unit 312A can be composed of a first NMOS transistor NM1 having a source-drain path formed between a first output terminal OUT1 and a first common node CM1 and whose gate receives the first reference phase clock signal CLK_REF0. And, the second injection unit 312B can be composed of a second NMOS transistor NM2 having a source-drain path formed between a second output terminal OUT2 and the first common node CM1 and whose gate receives the third reference phase clock signal CLK_REF180. That is to say, the first injection unit 312A is coupled to correspond to an input terminal to which the fourth phase clock signal CLK_MUL270 is inputted, and executes an injection operation in response to the first reference phase clock signal CLK_REF0. Further, the second injection unit 312B is coupled to correspond to an input terminal to which the second phase clock signal CLK_MUL90 is inputted, and performs an injection operation in response to the third reference phase clock signal CLK_REF180.

Next, the third and the fourth injection units 314A and 314B are for taking the second and the fourth reference phase clock signals CLK_REF90 and CLK_REF270, and injecting them into the second buffer unit 314. To this end, the third injection unit 314A can be composed of a third NMOS transistor NM3 having a source-drain path formed between a third output terminal OUT3 and a second common node CM2 and whose gate accepts the second reference phase clock signal CLK_REF90. And, the fourth injection unit 314B can be composed of a fourth NMOS transistor NM4 having a source-drain path formed between a fourth output terminal OUT4 and the second common node CM2 and whose gate receives the fourth reference phase clock signal CLK_REF270. That is, the third injection unit 314A is coupled to correspond to an input terminal to which the first phase clock signal CLK_MUL0 is inputted, and performs an injection operation in response to the second reference phase clock signal CLK_REF180. Further, the fourth injection unit 314B is coupled to correspond to an input terminal to which the third phase clock signal CLK_MUL180 is inputted and carries out an injection operation in response to the fourth reference phase clock signal CLK_REF270.

Thus, the first to fourth NMOS transistors NM1, NM2, NM3, and NM4 can repeatedly perform a turn-on and turn-off operation in response to the first to fourth reference phase clock signals CLK_REF0, CLK_REF90, CLK_REF180, and CLK_REF270 inputted thereto. Through such repetitive turn-on and turn-off operation of the first to fourth NMOS transistors NM1, NM2, NM3, and NM4, the first and the second buffer units 312 and 314 can receive the first to fourth reference phase clock signals CLK_REF0, CLK_REF90, CLK_REF180, and CLK_REF270 injected thereinto.

Meanwhile, the multi-phase clock correction circuit in accordance with the invention takes the first to fourth reference phase clock signals CLK_REF0, CLK_REF90, CLK_REF180, and CLK_REF270 that may be a mismatch in their phase differences to generate the first to fourth phase clock signals CLK_MUL0, CLK_MUL90, CLK_MUL180, and CLK_MUL270 with desired phase differences. Here, the first phase clock signal CLK_MUL0 can be a signal corresponding to the first reference phase clock signal CLK_REF0, the second phase clock signal CLK_MUL90 can be a signal corresponding to the second reference phase clock signal CLK_REF90, the third phase clock signal CLK_MUL180 can be a signal corresponding to the third reference phase clock signal CLK_REF180, and the fourth phase clock signal CLK_MUL270 can be a signal corresponding to the fourth reference phase clock signal CLK_REF270.

In other words, based on the first reference phase clock signal CLK_REF0, the second reference phase clock signal CLK_REF90 has a 90° phase difference, the third clock signal CLK_REF270 has a 180° phase difference, and the fourth clock signal CLK_REF270 has a 270° phase difference, but there may be a mismatch in their phase differences. The multi-phase clock correction circuit in accordance with the invention can accept the first to fourth reference phase clock signals CLK_REF0, CLK_REF90, CLK_REF180, and CLK_REF270, to generate the first to fourth phase clock signals CLK_MUL0, CLK_MUL90, CLK_MUL180, and CLK_MUL270 with predetermined phase differences therebetween. The second phase clock signal CLK_MUL90 has an accurately 90° phase difference from the first phase clock signal CLK_MUL0, the third phase clock signal CLK_MUL270 has an accurately 180° phase difference from the first phase clock signal CLK_MUL0, and the fourth phase clock signal CLK_MUL270 has an accurately 270° phase difference from the first phase clock signal CLK_MUL0.

Also, it is preferable that the first to fourth phase clock signals CLK_MUL0, CLK_MUL90, CLK_MUL180, and CLK_MUL270 so generated have the same frequency as the first to fourth reference phase clock signals CLK_REF0, CLK_REF90, CLK_REF180, and CLK_REF270. In this regard, operatiing characteristics of the ring oscillator 310 will be discussed below.

The ring oscillator 310 is oscillated at a free running frequency when power is applied. That is, the first to fourth phase clock signals CLK_MUL0, CLK_MUL90, CLK_MUL180, and CLK_MUL270 outputted from the ring oscillator 310 may have predetermined phase differences, but have a free running frequency rather than a predetermined frequency. Because of this, the invention employs an injection locking technique so as to output the first to fourth phase clock signals CLK_MUL0, CLK_MUL90, CLK_MUL180, and CLK_MUL270 having the same frequency as the first to fourth reference phase clock signals CLK_REF0, CLK_REF90, CLK_REF180, and CLK_REF270. That is, the injection locking technique is a technique that injects an oscillating signal outputted from a master oscillator into a slave oscillator, wherein an oscillation signal from the slave oscillator is synchronized with the oscillation signal from the master oscillator. This phenomenon will be referred to as "injection locking" below.

In comparison with FIG. 3, the oscillating signal from the master oscillator corresponds to the first to fourth reference phase clock signals CLK_REF0, CLK_REF90, CLK_REF180, and CLK_REF270, and the oscillating signal from the slave oscillator corresponds to the first to fourth phase clock signals CLK_MUL0, CLK_MUL90, CLK_MUL180, and CLK_MUL270. Thus, the multi-phase clock correction circuit in accordance with the invention injects the first to fourth reference phase clock signals CLK_REF0, CLK_REF90, CLK_REF180, and CLK_REF270 into the ring oscillator 310 although the ring oscillator 310 generates the first to fourth phase clock signals CLK_MUL0, CLK_MUL90, CLK_MUL180, and CLK_MUL270 with a free running frequency, such that it can generate the first to fourth phase clock signals CLK_MUL0, CLK_MUL90, CLK_MUL180, and CLK_MUL270 synchronized with the first to fourth reference phase clock signals CLK_REF0, CLK_REF90, CLK_REF180, and CLK_REF270. That is, when the first to fourth reference phase clock signals CLK_REF0, CLK_REF90, CLK_REF180, and CLK_REF270 are injected into the ring oscillator 310, the ring oscillator 310 can be injection-locked to generate the first to fourth phase clock signals CLK_MUL0, CLK_MUL90, CLK_MUL180, and CLK_MUL270, which are oscillated at a frequency corresponding to the first to fourth reference phase clock signals CLK_REF0, CLK_REF90, CLK_REF180, and CLK_REF270, rather than at a free running frequency, and thus have a desired frequency and predetermined phase differences.

Although the first to fourth reference phase clock signals CLK_REF0, CLK_REF90, CLK_REF180, and CLK_REF270 with phase differences other than the predetermined phase differences are inputted, the first to fourth phase clock signals CLK_MUL0, CLK_MUL90, CLK_MUL180, and CLK_MUL270 may be oscillated at a frequency corresponding to the first to fourth reference phase clock signals CLK_REF0, CLK_REF90, CLK_REF180, and CLK_REF270, rather than at a free running frequency, by injection-locking of the ring oscillator 310.

Meanwhile, the multi-phase clock correction circuit shown in FIG. 3 may be implemented in another manner, as follows. In other words, the multi-phase clock correction circuit of the invention may include a first multi-phase clock signal generator 312, 312A and 312B, and a second multi-phase clock signal generator 314, 314A and 314B.

The first multi-phase clock signal generator 312, 312A and 312b, which has a cross-coupled structure, is for differentially taking the first and the third reference phase clock signals CLK_REF0 and CLK_REF180 to generate their corresponding first and third phase clock signals CLK_MUL0 and CLK_MUL180 with a swing width corresponding to a bias voltage V_CML applied thereto. Here, the first multi-phase clock signal generator 312, 312A and 312B may be composed of the first buffer unit 312, and the first and the second injection units 312A and 312B, as described above.

The second multi-phase clock signal generator 314, 314A and 314B, which has a cross-coupled structure, is for differentially taking the second and the fourth reference phase clock signals CLK_REF90 and CLK_REF270 to produce their corresponding second and fourth phase clock signals CLK_MUL90 and CLK_MUL270 with a swing width corresponding to the bias voltage V_CML applied thereto. Here, the second multi-phase clock signal generator 314, 314A and 314B may be composed of the second buffer unit 314, and the second and the fourth injection units 314A and 314b, as mentioned above.

Figure 4:
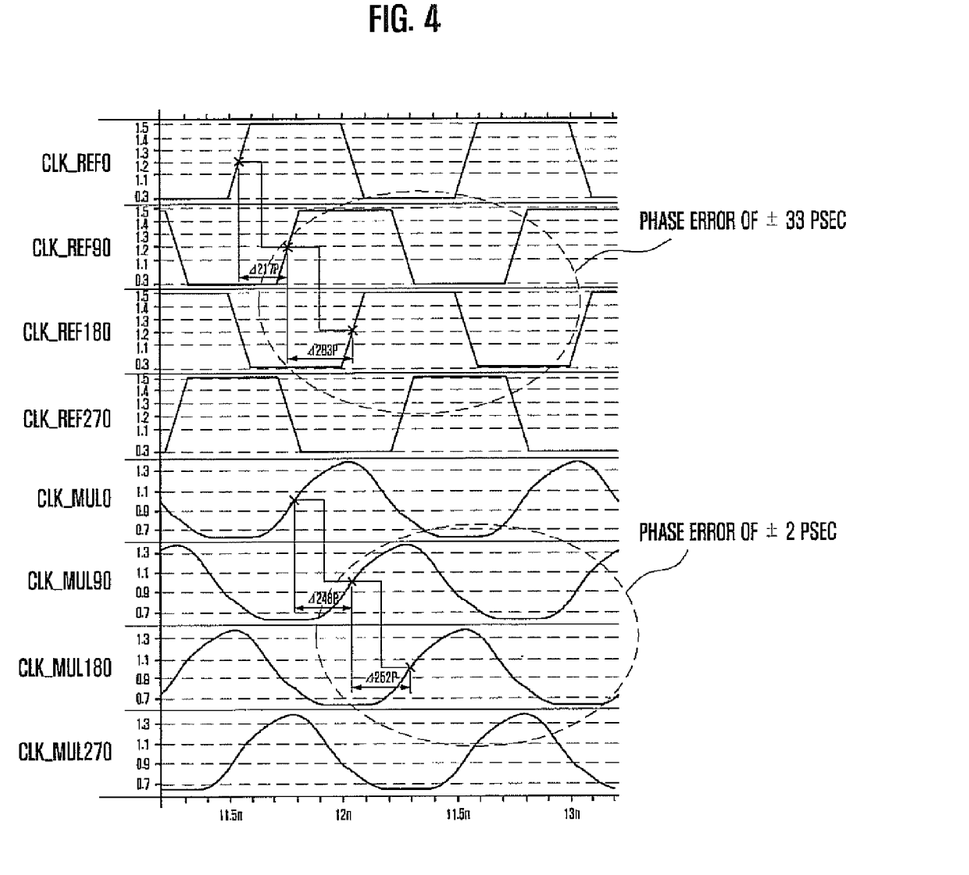
FIG. 4 is an operational waveform showing simulation results of the multi-phase clock correction circuit in FIG. 3.

FIG. 4 is an operational waveform showing simulation results of the multi-phase clock correction circuit illustrated in FIG. 3.

Shown in FIG. 4 are the first to fourth reference phase clock signals CLK_REF0, CLK_REF90, CLK_REF180, and CLK_REF270 having a frequency of 1 GHz, and the first to fourth phase clock signals CLK_MUL0, CLK_MUL90, CLK_MUL180, and CLK_MUL270 generated by the multi-phase clock correction circuit in accordance with the invention. If all the first to fourth reference phase clock signals CLK_REF0, CLK_REF90, CLK_REF180, and CLK_REF270 are ideal, each of them should have a phase difference of 500 psec. As can be seen from the drawing, however, the first and the second reference phase clock signals CLK_REF0 and CLK_REF90 have a phase difference by 217 psec, and the second and the third reference phase clock signals CLK_REF90 and CLK_REF180 have a phase difference by 283 psec. That is, there occurs a phase error by ±33 psec.

However, the multi-phase clock correction circuit in accordance with the invention takes the first to fourth reference phase clock signals CLK_REF0, CLK_REF90, CLK_REF180, and CLK_REF270 and corrects them, thereby generating the first to fourth phase clock signals CLK_MUL0, CLK_MUL90, CLK_MUL180, and CLK_MUL270 with almost perfect predetermined phase differences. As can be seen from the drawing, the first and the second phase clock signals CLK_MUL0 and CLK_MUL90 have a phase difference by 248 psec, and the second and the third reference phase clock signals CLK_MUL90 and CLK_MUL180 have a phase difference by 252 psec. That is, there takes place a phase error by ±2 psec.

As mentioned above, the multi-phase clock correction circuit in accordance with the invention can inject the reference phase clock signals into the ring oscillator to generate a multi-phase clock signal, which indicates the reference phase clock signals whose phases are corrected. The multi-phase clock signal so generated has predetermined phase differences and a frequency corresponding to the reference phase clock signals, thereby improving reliability of a circuit used.

While the multi-phase clock correction circuit of the embodiment illustrated above has been described with respect to a case of receiving plural reference phase clock signals to generate a multi-phase clock signal with a desired frequency and predetermined phase differences, it may also be applied to any case of receiving only one reference phase clock signal to generate a multi-phase clock signal. In this case, the injection units to which remaining reference phase clock signals are inputted may be omitted, but it is preferable to design in manner that they still receive their corresponding clock signals without omission, in consideration of circuit symmetries.

In addition, while the multi-phase clock correction circuit of the embodiment set forth above has been described with respect to a case of using two CML buffers having a crossed-couple structure, it may also be applied to any case of being provided with plural general CML buffers and injecting the reference phase clock signals thereinto.

It should be noted that the logic gates and transistors in the embodiment set forth above may be implemented at different places and in different types based on the polarity of input signals.

As a result, the ring oscillator in accordance with the invention can generate clock signals of a CML level, thereby decreasing power consumption in a high speed operation and also securing low jitter characteristics.

In addition, the invention injects reference phase clock signals into the ring oscillator to generate a stable multi-phase clock signal having predetermined phase differences and a frequency corresponding to the reference phase clock signals, so that the invention can improve reliability of a circuit operating in response to such a multi-phase clock signal.

While the invention has been described with respect to the specific embodiments, it will be apparent to those skilled in the art that various changes and modifications may be made without departing from the spirit and scope of the invention as defined in the following claims.

What is claimed is:
1. A multi-phase clock correction circuit, comprising:
an input unit for inputting reference phase clock signals, and
an oscillator configured to receive a bias voltage having a predetermined voltage level and to correct phases of the signals received via the input unit to generate a multi-phase clock signal, wherein the multi-phase clock signal has a swing width corresponding to the bias voltage, wherein the oscillator includes a plurality of buffer units, each of which includes:

a CML buffer circuit configured to differentially receive corresponding clock signals to differentially generate corresponding output signals, and a feedback circuit, provided at a differential output end of the CML buffer circuit, configured to perform a feedback operation.

2. The multi-phase clock correction circuit as recited in claim 1, wherein each of the plurality of buffer units has a cross-coupled structure.

3. The multi-phase clock correction circuit as recited in claim 1, wherein the swing width of the multi-phase clock signal is smaller than a potential difference between power supply voltages applied to the oscillator.

4. The multi-phase clock correction circuit as recited in claim 1, wherein the multi-phase clock signal includes first to fourth clock signals, and the plurality of buffer units includes a first buffer unit configured to buffer the second and the fourth phase clock signals to generate the first and the third phase clock signals, and a second buffer unit configured to buffer the first and the third phase clock signals to generate the second and the fourth phase clock signals.

5. The multi-phase clock correction circuit as recited in claim 4, wherein a differential output end of the second buffer unit and a differential input end of the first buffer unit are connected so as to have a cross-coupled structure.

6. The multi-phase clock correction circuit as recited in claim 1, wherein the CML buffer circuit includes a differential input unit configured to differentially input the corresponding clock signals, a loading unit coupled between a first power supply voltage terminal and the input unit, and a sinking unit, coupled between the input unit and a second power supply voltage terminal, configured to sink a current corresponding to the bias voltage.

7. The multi-phase clock correction circuit as recited in claim 1, wherein the feedback circuit is connected in a cross-coupled manner correspondingly to the differential input unit to operate in response to an output signal from the CML buffer circuit.

8. The multi-phase clock correction circuit as recited in claim 6, wherein the input unit is coupled to correspond to the differential input unit and injects the reference phase clock signals to the oscillator.

\* \* \* \* \*